United States Patent
Tahara et al.

(10) Patent No.: US 7,022,373 B2
(45) Date of Patent: Apr. 4, 2006

(54) METHOD OF FORMING COMPOSITE INSULATING LAYER AND PROCESS OF PRODUCING WIRING BOARD

(75) Inventors: Nobuharu Tahara, Ibaraki (JP); Toshiyuki Kawashima, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 107 days.

(21) Appl. No.: 10/780,677

(22) Filed: Feb. 19, 2004

(65) Prior Publication Data
US 2004/0170754 A1 Sep. 2, 2004

(30) Foreign Application Priority Data
Feb. 27, 2003 (JP) ............... P.2003-050391

(51) Int. Cl.
*B05D 5/12* (2006.01)

(52) U.S. Cl. .............. 427/96; 427/337; 427/379

(58) Field of Classification Search ............ None
See application file for complete search history.

(56) References Cited

U.S. PATENT DOCUMENTS 6,759,082 B1 * 7/2004 Ikeda et al. ............. 427/58

2002/0121334 A1 * 9/2002 Ikeda et al. ............. 156/246

FOREIGN PATENT DOCUMENTS

| EP | 1327517 | * | 7/2003 |
|---|---|---|---|
| JP | 2000-319442 | * | 11/2000 |
| JP | 2002-043743 | * | 2/2002 |
| JP | 2002-361661 | * | 12/2002 |
| JP | 2003-201363 | * | 7/2003 |

* cited by examiner

*Primary Examiner*—Erma Cameron

(74) *Attorney, Agent, or Firm*—Sughrue Mion, PLLC

(57) ABSTRACT

A method of forming a composite insulating layer in which a thin and uniform adhesive layer can be formed, and an adhesive strength between an adhesive layer and a porous layer is sufficient, a insulating layer obtained by the formation method, and a process of producing a wiring board, wherein an insulating layer is formed by the formation method, are disclosed. The method of forming a composite insulating layer includes a step of forming an adhesive layer 2 containing a partially imidated polyamic acid on a metallic foil 1; a step of applying a solution 3 containing a polyamic acid to the surface of the adhesive layer 2; a step of subjecting the coated solution 3 to phase separation to form a porous layer 4; and a step of subjecting the adhesive layer 2 and the porous layer 4 to imide conversion.

3 Claims, 2 Drawing Sheets

METHOD OF FORMING COMPOSITE INSULATING LAYER AND PROCESS OF PRODUCING WIRING BOARD

FIELD OF THE INVENTION

The present invention relates to a method of forming a composite insulating layer comprising a polyimide resin-made adhesive layer and a porous layer, an insulating layer obtained by the subject formation method, and a process of producing a wiring board by forming an insulating layer by the subject formation method. The invention is especially useful as a technology of forming an insulating layer of high-frequency wiring board corresponding to high-frequency signals of a frequency of 600 MHz or more.

DESCRIPTION OF THE RELATED ART

In recent years, following an increase in speed of information processing in information and communication instruments and an increase in frequency, wiring boards on which electronic parts, etc. are mounted are required to have a performance adaptive to high frequencies. For example, in order to reveal excellent high-frequency transmission characteristics, insulating layers of wiring boards are required to have a small dielectric constant and a small dielectric dissipation factor in high frequencies.

That is, an energy loss that is called a dielectric loss occurs within a circuit of wiring board during the transmission step. This dielectric loss is in proportion to the product of a frequency (f) of signal, the one-second power of a dielectric constant ($\epsilon$) and a dielectric dissipation factor (tan $\delta$) of material. For this reason, in high-frequency wiring boards having a large frequency (f), materials having small dielectric constant ($\epsilon$) and dielectric dissipation factor (tan $\delta$) are especially required. Also, since the transmission speed of signal is in inverse proportion to the one-second power of dielectric constant ($\epsilon$), materials having a small dielectric constant ($\epsilon$) are desired in high-frequency applications in view of this matter.

As the method of forming such insulating layers having a low dielectric constant and a low dielectric dissipation factor, a method of using a resin material having itself a low dielectric constant was hitherto general. As such low-dielectric constant resin materials, there are known, for example, fluorine-containing polymers such as polytetrafluoroethylene and polyimide resins.

As a method of forming an insulating layer having a dielectric constant lower than that of a resin material itself, there is present a technology in which the insulating layer is of a porous structure. For example, porous dielectric materials made of a high heat resistant resin film having a porous structure having fine open cells and having a porosity of from 15 to 80% are known. Specifically, polyimide porous films obtained by forming a porous film of a polyamic acid by wet coagulation and subjecting the porous film to imide conversion are disclosed (see, for example, JP-A-2000-319442, page 1 and FIG. 1).

On the other hand, in the case where the foregoing porous film is used for a insulating layer of wiring board, for the sake of enhancing the adhesiveness of the porous film to a metallic layer or a wiring pattern, it is preferable to make an adhesive layer lie therebetween. Also, in etching the metallic layer laminated on the porous film via the adhesive layer, the adhesive layer enables one to prevent occurrence of migration of an etching liquid caused by penetration of the etching liquid into the porous film. However, for the purpose of enhancing an effect of attaining a low dielectric constant by the porous layer, it is desired that the thickness of the adhesive layer is as thin as possible.

As a method of laminating a metallic layer on a porous film via an adhesive layer, there is known, for example, a method in which a dope containing a polyamic acid is coated on a metallic foil and dried to form a film, a dope containing a polyamic acid is again coated on the film and dipped in water to form a porous film, and imide conversion of the filmed adhesive layer and the porous layer is then carried out at the same time (see, for example, JP-A-2002-43743, page 2 and FIG. 3).

However, according to the above-described method of forming a porous layer on the surface of an adhesive layer, in coating a dope for forming the porous layer on the adhesive layer before imidation, the adhesive layer causes redissolution so that a uniform adhesive layer cannot be formed. As a result, areas where no adhesive layer is present are caused, whereby a problem by penetration of the etching liquid into the porous film likely occurred.

On the other hand, by imidating the adhesive layer prior to coating the dope for forming the porous layer, it is possible to prevent the redissolution. However, according to this method, it was noted that an adhesive strength between the adhesive layer and the porous layer is insufficient.

SUMMARY OF THE INVENTION

Accordingly, one object of the present invention is to provide a method of forming a composite insulating layer in which a thin and uniform adhesive layer can be formed, and an adhesive strength between an adhesive layer and a porous layer is sufficient.

Another object of the present invention is to provide an insulating layer obtained by the formation method.

Still another object of the present invention is to provide a process of producing a wiring board capable of forming an insulating layer by the formation method.

As a result of intensive and extensive investigations to achieve the above objects, it has been found that when a polyamic acid contained in an adhesive layer is partially imidated, and after forming a porous layer, the both layers are subjected to imide conversion, an adhesive strength between the adhesive layer and the porous layer increases. The present invention has been completed based on this finding.

Figure 1A:
FIGS. 1A–1D are a process chart showing one embodiment of the method of forming a composite insulating layer according to the present invention.

1: Metallic foil
2: Adhesive layer
3: Solution containing polyamic acid
4: Porous layer

DETAILED DESCRIPTION OF THE INVENTION

The method of forming a composite insulating layer according to the present invention comprises:

a step of forming an adhesive layer containing a partially imidated polyamic acid on a metallic foil;

a step of applying a solution containing a polyamic acid to the surface of the adhesive layer;

a step of subjecting the coated solution to phase separation to form a porous layer; and a step of subjecting the adhesive layer and the porous layer to imide conversion.

The term "partially imidated" used herein means that an imido ring is partially contained in a repeating unit of the polyamic acid, and the presence of the imido ring can be evaluated by infrared absorption spectrum.

According to the above method, the polyamic acid contained in the adhesive layer is partially imidated. Accordingly, in applying a dope for forming the porous layer, redissolution of the adhesive layer becomes difficult, and hence, by forming the thin and uniform adhesive layer in advance, such a state is maintained. Further, since the adhesive layer is not completely imidated, when after forming the porous layer, the both layers are subjected to imide conversion, it is possible to increase the adhesive strength between the adhesive layer and the porous layer. As a result, it is possible to provide a method of forming a composite insulating layer in which a thin and uniform adhesive layer can be formed, and the adhesive strength between the adhesive layer and the porous layer becomes sufficient.

The partially imidated polyamic acid preferably has a ratio RA (=A1/A2) of an absorbance A1 derived from a C=O bond of an imido ring to an absorbance A2 derived from a C=O bond of an amide acid in the infrared absorption spectrum of 0.1–5.0. This RA is specifically measured by the method described in the Examples as described hereinafter. When the absorbance ratio RA of the polyamic acid contained in the adhesive layer falls within the above specific range, it is possible to further surely realize suppression of redissolution of the adhesive layer and increase of the adhesive strength.

The step of forming an adhesive layer preferably comprises applying a solution containing a polyamic acid to the surface of the metallic foil, and then conducting drying of a solvent contained therein and partial imidation of the polyamic acid, by heating. By applying the solution, the adhesiveness to the metallic foil increases, and the subsequent heating makes it possible to easily control a degree of partial imidation of the polyamic acid.

The composite insulating layer according to the present invention is formed by the above formation method. For this reason, by the action and effect described above, not only a thin and uniform adhesive layer can be formed, but also an adhesive strength between the adhesive layer and the porous layer becomes sufficient.

The process of producing a wiring board according to the present invention comprises:

a step of forming an insulating layer, and a step of forming a wiring layer, wherein the insulating layer is formed by the above-described method of forming a composite insulating layer.

According to the above process, by the above-described action and effect, not only a thin and uniform adhesive layer can be formed, but also an adhesive strength between the adhesive layer and the porous layer becomes sufficient.

Accordingly, breaking of wire caused due to peeling of the insulating layer is difficult to occur so that the wiring board has high durability and reliability.

The embodiments of the present invention will be described below with reference to the drawings.

Formation Method of Composite Insulating Layer

Figure 1B:

FIGS. 1A–1D are a process chart showing one embodiment of the method of forming a composite insulating layer according to the present invention. The method includes a step of forming an adhesive layer 2 containing a partially imidated polyamic acid on a metallic foil 1 as shown in FIG. 1B.

The metallic foil 1 may be made of any material of copper, nickel, gold, silver, etc. Of these metals, copper is preferable from the standpoints of conductivity as a wiring pattern, processability, etc. The metallic foil 1 preferably has a thickness of 1–50 µm. To increase the adhesive strength of the metallic foil 1 to the adhesive layer 2, the surface of the metallic foil 1 may be subjected to various physical or chemical surface treatments such as roughing treatment or blackening treatment.

The adhesive layer 2 may be formed by a method of laminating a separately prepared film. However, a method of coating a solution containing a polyamic acid on the surface of the metallic foil 1 and then drying the solvent and partially imidating the polyamic acid by heating is preferable.

The coating method of the solution includes coating methods using a blade coater, a comma coater, a roll coate, a calender coater, a bar coater, etc. The thickness of the resulting adhesive layer 2 is preferably 0.5–10 µm, and more preferably 1–5 µm, from the standpoint of realizing an effect of preventing penetration of an etching liquid and a low dielectric constant in good balance. Where the metallic foil 1 has been subjected to roughing treatment, the thickness of the adhesive layer 2 is based on the thickness of convex parts of the unevenness of the roughed surface.

The solution containing a polyamic acid can be obtained by, for example, a method of reacting approximately equimolar amounts of a tetracarboxylic acid component and a diamine component in a solvent or a method of dissolving a polyamic acid obtained by previously polymerizing the same monomers in a solvent. The concentration of the polyamic acid is preferably 5–25% by weight in the solution from the standpoint of easiness of the coating step or the drying step.

Examples of the tetracarboxylic acid component include pyromellitic anhydride, 3,3',4,4'-benzophenonetetracarboxylic dianhydride, 3,3',4,4'-biphenyltetracarboxylic dianhydride, 2,3,3',4-biphenyltetracarboxylic dianhydride, 2,3,6,7-naphthalenetetracarboxylic dianhydride, 1,2,5,6-naphthalenetetracarboxylic dianhydride, 1,4,5,8-naphthalenetetracarboxylic dianhydride, 2,2'-bis(3,4-dicarboxyphenyl)propane dianhydride, bis(3,4-dicarboxyphenyl)sulfone dianhydride, perylene-3,4,9,10-tetracarboxylic dianhydride, bis(3,4-dicarboxyphenyl) ether dianhydride, and ethylenetetracarboxylic dianhydride.

Examples of the diamine component include 4,4'-diaminodiphenyl ether (DDE), 4,4'-diaminodiphenylmethane, 3,3'-diaminodiphenylmethane, 3,3'-dichlorobenzidine, 4,4-diaminodiphenylsulfide-3,3'-diaminodiphenylsulfone, 1,5-diaminonaphthalene, m-phenylenediamine, p-phenylenediamine (PPD), 3,3'-dimethyl-4,4'-biphenyldiamine, benzidine, 3,3'-dimethylbenzidine, 3,3'-dimethoxybenzidine, 4,4'-diaminophenylsulfone, 4,4'-diaminodiphenyl sulfide, 4,4'-diaminodiphenylpropane, 2,4-bis(β-amino-t-butyl)

toluene, bis(p-β-amino-t-butylphenyl) ether, bis(p-β-methyl-δ-aminophenyl)benzene, bis-p-(1,1-dimethyl-5-amino-pentyl)benzene, 1-isopropyl-2,4-m-phenylenediamine, m-xylylenediamine, p-xylylenediamine, di(p-aminocyclohexyl)methane, hexamethylenediamine, heptamethylenediamine, octamethylenediamine, nonamethylenediamine, decamethylenediamine, diaminopropyltetramethylene, 3-methylheptamethylenediamine, 4,4-dimethylheptamethylenediamine, 2,11-diaminododecane, 1,2-bis-3-aminopropoxyethane, 2,2-dimethylpropylenediamine, 3-methoxyhexamethylenediamine, 2,5-dimethylhexamethylenediamine, 2,5-dimethylheptamethylenediamine, 2,5-dimethylheptamethylenediamine, 3-methylheptamethylenediamine, 5-methylnonamethylenediamine, 2,11-diaminododecane, 2,17-diaminoeicosadecane, 1,4-diaminocyclohexane, 1,10-diamino-1,10-dimethyldecane, 1,12-diaminooctadecane, 2,2-bis[4-(4-aminophenoxy)phenyl]propane, piperazine, $H_2N(CH_2)_3O(CH_2)_2O(CH_2)NH_2$, $H_2N(CH_2)_3S(CH_2)_3NH_2$, and $H_2N(CH_2)_3N(CH_3)_2(CH_2)_3NH_2$.

The polyamic acid suitably used is BPDA (biphenyltetracarboxylic acid dianhydride)-DDE (diaminodiphenyl ether)-PPD (p-phenylenediamine) based polyamic acids. Especially, the polyamic acids having a DDE/PPD molar ratio of from 30/70 to 10/90 are preferable.

The solvent used is not particularly limited. Examples of the solvent include N-methyl-2-pyrrolidone, N,N-dimethylacetamide, N,N-dimethylformamide, and dimethyl sulfoxide.

Drying the solvent and partial imidation of the polyamic acid by heating may be carried out successively or simultaneously. Drying the solvent prior to the partial imidation is preferable from the standpoint of obtaining a uniform adhesive layer. The drying may be effected by hot air drying or drying using a heater and is preferably carried out at a temperature of 90–120° C. for 1–5 minutes.

To realize suppression of redissolution of the adhesive layer and increase of the adhesive strength, the partial imidation of the polyamic acid is preferably carried out at 120–300° C. for 1–60 minutes. By changing the heating temperature and heating time, it is possible to alter the degree of partial imidation.

The degree of partial imidation of the polyamic acid contained in the adhesive layer 2 can be quantitatively determined by a ratio RA (=A1/A2) of an absorbance A1 derived from a C=O bond of an imido ring to an absorbance A2 derived from a C=O bond of an amide acid in the infrared absorption spectrum. The absorbance ratio RA is preferably 0.1–5.0, and more preferably 0.5–3.0.

Figure 1C:
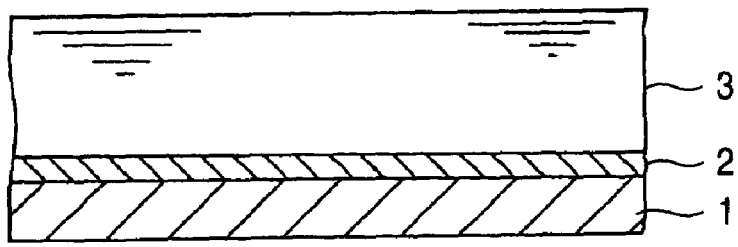

The method of forming a composite insulating layer includes a step of applying a solution 3 containing a polyamic acid to the surface of the adhesive layer 2 as shown in FIG. 1C. As the polyamic acid, the same polyamic acid as in the adhesive layer 2 can be used. However, the concentration of the polyamic acid is preferably 5–25% by weight, and more preferably 7–20% by weight. When the concentration is too high, the viscosity becomes excessively high so that handling is difficult, whereas when the concentration is too low, formation of a porous layer tends to become difficult.

A rate of solvent displacement during phase separation may be adjusted by mixing a solvent, such as diethylene glycol dimethyl ether or diethylene glycol diethyl ether, as other component to be contained in the solution 3. Further, to control a pore shape and a pore size, an inorganic compound such as lithium nitrate or an organic compound such as polyvinylpyrrolidone can be added. The additive is preferably added in an amount such that the concentration of the additive is 1–10% by weight in the solution. If lithium nitrate is added, the displacement rate of the coagulation liquid with the solvent is fast so that it is possible to form a finger void structure (a structure having finger-like voids) in a sponge structure. If an additive of making the coagulation speed slow, such as polyvinylpyrrolidone, is added, a porous film having the sponge structure uniformly spread can be obtained.

The coating method of the solution 3 is the same as the method of coating and forming the adhesive layer 2. The coating temperature is preferably in the range from −20 to 40° C. The coating thickness is determined according to the thickness of a porous layer 4 finally formed and the concentration of the polyamic acid.

Figure 1D:
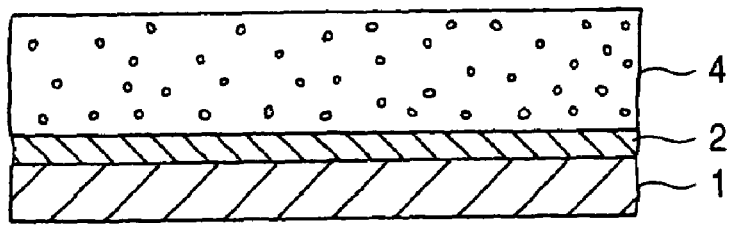

The method of forming a composite insulating layer according to the present invention further includes a step of subjecting the coated solution 3 to phase separation to form a porous layer 4, as shown in FIG. 1D. The phase separation method includes a method of dipping in a coagulation liquid, a method of changing the temperature, a method of moisture absorption from a gaseous phase, a method of removing the solvent, and a combination of these methods. However, a method of dipping the solution-coated material in a coagulation liquid (wet coagulation method) is preferable from the standpoints of costs of film formation step and the time required.

According to the wet coagulation method, in general, a film-forming solution (dope) is applied (cast) to a substrate, the coated substrate is dipped in a coagulation liquid for solvent displacement to coagulate (gelate) a resin, the solvent is then removed by water washing, etc., and the coagulation liquid is dried and removed to obtain a porous film.

The coagulation liquid is not limited so far as it does not dissolve the polyamic acid used and is compatible with the solvent. Examples of the coagulation liquid include water, alcohols such as methanol, ethanol or isopropanol, and mixed solutions thereof. Of those, water is especially preferably used. The temperature of the coagulation liquid in dipping is not particularly limited, but is preferably 0–80° C.

In the present invention, by absorbing moisture in the solution before dipping in the coagulation liquid to coagulate or partially coagulate the solution and then dipping in the coagulation liquid, it is possible to increase the porosity in the vicinity of the surface of the porous film and to increase the mean pore size of the surface by gradually providing moisture from the gaseous phase and proceeding with coagulation.

Water washing is preferably carried out. The water washing may be carried out subsequent to or separately with dipping in the coagulation liquid (coagulation step). The water washing temperature is preferably 20–70° C.

After water washing, the porous film is taken out and then dried if necessary. The drying temperature is not particularly limited so far as pores of the porous film are not clogged. Subsequent to or simultaneous with drying, imidation described hereinafter may be carried out.

The method of forming a composite insulating layer according to the present invention further includes a step of subjecting the adhesive layer 2 and the porous layer 4 to imide conversion. For this step, the same conditions as conventional can be employed. For example, the adhesive layer 2 and the porous layer 4 may be maintained in a heating unit at 300–500° C. for 1–3 hours. Further, it is preferable from the standpoint of suitably removing cyclized water to circulate hot air and make the system in a nitrogen atmosphere.

The composite insulating layer is a composite insulating layer formed by the above-described formation method of a composite insulating layer. Preferably, the thickness of the adhesive layer 2 is 2–5 µm; the thickness of the porous layer 4 is 10–40 µm; and a 180° peeling strength between the adhesive layer 2 and the porous layer 4 is 400–600 g/cm (0.39–0.59 N/mm). Further, it is preferable that the thickness of the adhesive layer 2 is uniform and that a scattering in thickness of the adhesive layer and the porous layer is within ±20%.

Other Embodiment of Formation Method of Composite Insulating Layer (1) The adhesive layer containing a partially imidated polyamic acid may be formed on the metallic foil by a method of laminating a material separately prepared in a form of a film. In this case, a method may be used in which the solution containing a polyamic acid is applied to the surface of a peelable substrate, and the solvent is dried by heating to form a film, and if necessary, the polyamic acid is partially inidated.

The lamination of the film can be carried out using various laminators utilizing heating or pressurization, but use of a vacuum laminator is preferable.

(2) The method of forming a composite insulating layer may be a method in which a composite insulating layer is formed on a metallic foil formed on the surface of a wiring board or a insulating layer.

Production Process of Wiring Board

Figure 2:
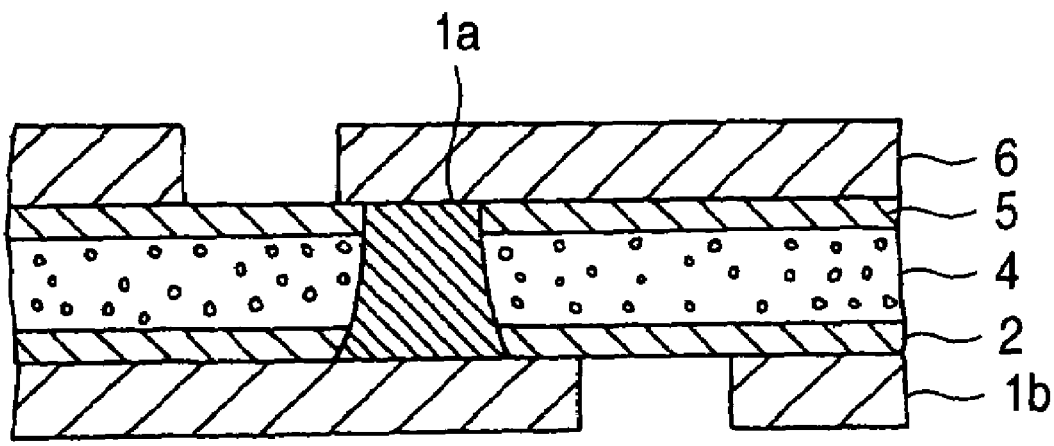
FIG. 2 is a cross-sectional view showing one embodiment of a wiring board produced by the process according to the present invention.

The process of producing a wiring board according to the present invention includes a step of forming a insulating layer and a step of forming a wiring layer, wherein the insulating layer is formed by the above-described formation method of a composite insulating layer. The embodiment wherein a wiring board having a conductive connection structure is produced between wiring layers as shown in FIG. 2 will be described below.

In the process of producing a wiring board, any of conductive connection structures such as metallic pole, plated through-hole, conductive paste, plated laser via, and filled via can be used. In this embodiment, the case where a conductive connection structure is formed by metallic pole as shown in FIG. 2 is illustrated.

The metallic foil 1 shown in FIG. 1A is replaced by a protrusion-provided metallic foil 1 having conductive protrusions 1*a* having approximately the same height. Examples of the method of forming the protrusion-provided metallic foil 1 include a method of forming it by etching, a method of forming by plating, and a method of forming it with a conductive paste. The thickness of the metallic foil portion of the protrusion-provided metallic foil 1 is preferably 1–50 µm. The height of the conductive protrusions 1*a* is preferably 2–100 µm, and more preferably 5–50 µm.

The method of forming the protrusion-provided metallic foil 1 by etching is, for example, a method in which etching is carried out selectively using a laminated plate made of two kinds of metallic layers or a method in which one kind of metallic layer is subjected to half etching. Cladding materials and plating materials can be used as the laminated plate.

An adhesive layer 2 and a porous layer 4 are then formed on the protrusion-provided metallic foil 1 in the same manner as described previously. However, with respect to the method of forming the adhesive layer 2, a method of using a previously filmed sheet or a method of coating a solution using a curtain coater, etc., is preferable such that the conductive productions 1*a* are not obstructive.

After laminating an adhesive layer 5, the conductive protrusions 1*a* are exposed from the adhesive layer 5. Specifically, the surface portion of the adhesive layer 5 may be removed by sputtering, alkaline treatment of the surface, plasma etching, abrasive roll, etc.

A metallic layer is laminated on and integrated with the adhesive layer 5 so as conductively connect to the conductive protrusions 1*a*. Examples of the lamination and integration method include adhesion by heat press and adhesion by heating as described previously.

In this embodiment, the metallic layer and the adhesive layer may be conductively connected to each other via a conductive paste. In this case, the conductive paste may be applied to the upper surfaces of the conductive protrusions exposed from the adhesive layer by a screen printing method, etc. The conductive paste preferably contains a resin component that is cured by heating, etc., in laminating and integrating the metallic layer with the adhesive layer.

The resulting metallic foil laminated plate is optionally subjected to pattern formation to form wiring layers 6 and 1*b*. The resulting laminated plate can be used as a core board or a board for lamination of double-layer wiring boards or multilayered wiring boards. The pattern formation is carried out by, for example, etching using an etching liquid, etc. For etching, an etching liquid corresponding to the kind of metal is used, and for pattern etching, dry film resists, etc., can be used.

Figure 3:
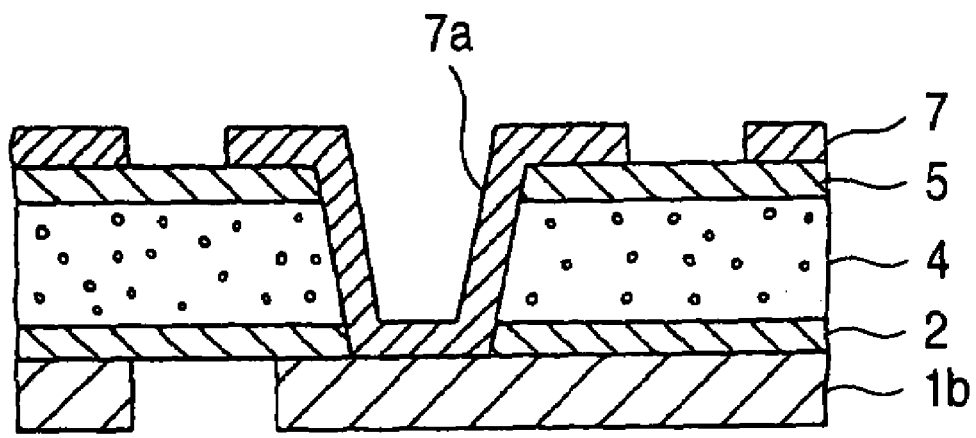
FIG. 3 is a cross-sectional view showing another embodiment of a wiring board produced by the process according to the present invention.

Other Embodiment of Production Process of Wiring Board (1) The process of producing a wiring board may be a process of producing a wiring board as shown in FIG. 3. This embodiment is an embodiment that openings formed by laser irradiation, etc., are plated to form a conductive connection structure between wiring layers.

For example, an adhesive layer 5 is formed on the laminated plate shown in FIG. 1D, and openings are then formed upon irradiation with laser, etc. The insides of openings and the surface are plated to form a metallic layer, and a pattern is then formed by etching, thereby forming plated vias 7*a* and a wiring layer 7.

(2) Especially, in the case where the wiring board is used for high frequency, a micro-strip line may be formed by a signal line and a ground layer or a power source layer, and a ground layer or a power source layer may be formed on the both surfaces of a signal line via a insulating layer.

The present invention is described in more detail by reference to the following examples, but it should be understood that the invention is not construed as being limited thereto.

Each of evaluation values of the composite insulating layer was measured in the following manner.

(1) Mean Pore Size of Porous Layer

A cross section of the porous layer was photographed using a scanning electron microscope (SEM), and a mean pore size was determined from image analysis of the photograph by a computer.

(2) Porosity of Porous Layer

Volume and weight of the porous layer were measured to determine a specific gravity of the porous layer. Porosity was determined from this specific gravity and a specific gravity of a material according to the following equation.

$$\text{Porosity (\%)}=[1-(\text{Specific gravity of porous layer})/(\text{Specific gravity of material})]\times 100$$

(3) Evaluation of Degree of Partial Imidation

The adhesive layer was measured with respect to infrared absorption spectrum at a resolution of 8 cm$^{-1}$ and at a number of integration of 64 scans by the ATR technique (double transverse technique: Ge 45) using a Fourier transform infrared spectrophotometer (manufactured by Nicolet Instruments, NEXUS 670, Qmmi Sample). A ratio RA (=A1/A2) of an absorbance A1 derived from a C=O bond of an imido ring at 1774 cm$^{-1}$ to an absorbance A2 derived from a C=O bond of an amide acid at 1654–1674 cm$^{-1}$ was then determined.

(4) Evaluation of Adhesive Strength

Using an autograph manufactured by Shimadzu Corporation, a sample prepared by etching a copper foil in a width of 5 mm and cutting into a stripe form in the copper foil width was fixed in the porous layer side and peeled apart at an interface between the porous layer and the adhesive layer to measure a 180° peeling strength (g/cm).

(5) Evaluation of Ethanol Penetration

Ethanol-containing paper was placed on the surface of the adhesive layer of the composite insulating layer, and whether or not a portion into which ethanol had penetrated was present was visually evaluated.

FORMATION EXAMPLE 1 OF ADHESIVE LAYER

On a matted surface of an electrolyzed copper foil having a thickness of ½ oz (manufactured by Furukawa Circuit Foil Co., Ltd.), a 15 wt % solution of a BPDA (biphenyltetracarboxylic acid dianhydride)/DDE (diaminodiphenyl ether)/PPD (p-phenylenediamine) based polyimide precursor in N-methyl-2-pyrrolidone (NMP) as a film-forming solution (PPD/DDE molar ratio: 85/15) was applied at a uniform thickness using a film applicator at a gap of 50 μm. The coating was heated for drying at 100° C. for 4 minutes and then heat treated at the heating temperature and for the heating time as shown in Table 2. There were thus formed uniform adhesive layers having a thickness of 2 μm and made of a polyamic acid or a polyimide having a varied degree of partial imidation.

FORMATION EXAMPLE 2 OF ADHESIVE LAYER

Adhesive layers having a uniform thickness were formed in the same manner as in Formation Example 1 of Adhesive Layer, except for using the heating temperature and heating time as shown in Table 3 as the heating condition and changing the gap of the film applicator to form an adhesive layer having a thickness of 3 μm.

Further, adhesive layers were formed in the same manner as above, except for changing a part of the adhesive layer and changing the heating temperature and heating time, and then evaluated with respect to the degree of partial imidation. The results obtained are shown in Table 1.

TABLE 1

| Heating temperature | Heating time | A1 | A2 | RA |
| --- | --- | --- | --- | --- |
| 120° C. | 20 min | 0.024 | 0.068 | 0.35 |
| 180° C. | 20 min | 0.055 | 0.060 | 0.92 |
| 200° C. | 20 min | 0.069 | 0.052 | 1.33 |
| 220° C. | 20 min | 0.079 | 0.028 | 2.82 |

TABLE 1-continued

| Heating temperature | Heating time | A1 | A2 | RA |
| --- | --- | --- | --- | --- |
| 240° C. | 20 min | 0.092 | Not detected | — |
| 300° C. | 20 min | 0.092 | Not detected | — |

FORMATION EXAMPLE 1 OF POROUS LAYER

On the surface of each adhesive layer of the laminated plates obtained in Formation Examples 1 and 2 of Adhesive Layer, a 19 wt % solution of a BPDA (biphenyltetracarboxylic acid dianhydride)/DDE (diaminodiphenyl ether)/PPD (p-phenylenediamine) based polyimide precursor in N-methyl-2-pyrrolidone (NMP) as a film-forming stock solution (PPD/DDE molar ratio: 85/15) was applied at a uniform thickness using a film applicator at a gap of 100 μm. After applying, the resulting laminated plate was dipped in pure water at 25° C. to coagulate the polyimide precursor. After coagulation, the resulting plate was dried at 90° C. for at least one hour. After drying, the plate was heat treated in a nitrogen atmosphere at 410° C. for 20 minutes to form a composite insulating layer in which the both layers were completely imidated. The porous layer of this composite insulating layer had a thickness of 20 μm, an internal mean pore size of 0.3 μm, and a porosity of about 40%.

With respect to this composite insulating layer, an adhesive strength between the adhesive layer and the porous layer was measured. The results are shown in Tables 2 to 3 together with the heating conditions. Further, the composite insulating layer from which the metallic foil had been removed by etching with an etching liquid was evaluated with respect to the penetration properties using ethanol. As a result, it was noted that in any of the composite insulating layers, penetration of ethanol did not occur so that the adhesive layer was maintained uniformly.

TABLE 2

| | 180° Peeling strength (g/cm) Time | | |
| --- | --- | --- | --- |
| Temperature | 20 min | 6.5 min | 4 min |
| 200° C. | 400 | 420 | 500 |
| 300° C. | 280 | 290 | 315 |
| 410° C. | 275 | 280 | 280 |

TABLE 3

| | 180° Peeling strength (g/cm) Time | | |
| --- | --- | --- | --- |
| Temperature | 20 min | 6.5 min | 4 min |
| 200° C. | 433 | 440 | 480 |
| 300° C. | 320 | 360 | 385 |
| 410° C. | 255 | 301 | 314 |

It is apparent from the results shown in Tables 2 to 3 that, in the heating treatment at a temperature exceeding 300° C., the adhesive strength between the adhesive layer and the porous layer becomes insufficient due to complete imidation of the adhesive layer, whereas in the adhesive layer partially imidated at low temperatures, the adhesive strength between the adhesive layer and the porous layer markedly increases.

FORMATION EXAMPLE 2 OF POROUS LAYER

On an adhesive layer formed in the same manner as in Formation Example 1 of Adhesive Layer, except for performing only drying at 100° C. for 4 minutes without carrying out the heating treatment, a porous layer was formed in the same manner as in Formation Example 1 of Porous Layer. The resulting composite insulating layer had a high 180° peeling strength of 800 g/cm. However, when the penetration properties were evaluated using ethanol, it was found that a portion into which ethanol had penetrated was observed so that the adhesive layer caused redissolution and partial breakage.

It should further be apparent to those skilled in the art that various changes in form and detail of the invention as shown and described above may be made. It is intended that such changes be included within the spirit and scope of the claims appended hereto.

This application is based on Japanese Patent Application No. 2003-050391 filed Feb. 27, 2003, the disclosure of which is incorporated herein by reference in its entirety.

What is claimed is:

1. A method of forming a composite insulating layer, comprising:
    a step of forming an adhesive layer containing a partially imidated polyamic acid on a metallic foil;
    a step of applying a solution containing a polyamic acid to the surface of the adhesive layer;
    a step of subjecting the coated solution to phase separation to form a porous layer; and
    a step of subjecting the adhesive layer and the porous layer to imide conversion,
    wherein the partially imidated polyamic acid has a ratio $RA(=A1/A2)$ of an absorbance $A1$ derived from a C=O bond of an imido ring to an absorbance $A2$ derived from a C=O bond of an amide acid in the infrared absorption spectrum of 0.1–5.0.

2. The method as claimed in claim 1, wherein the step of forming an adhesive layer comprises applying a solution containing a polyamic acid to the surface of the metallic foil, and then conducting drying of a solvent contained therein and partial imidation of the polyamic acid, by heating.

3. A process of producing a wiring board, comprising a step of forming an insulating layer and a step of forming a wiring layer, wherein the step of forming an insulating layer is carried out to form the insulating layer by the method as claimed in claim 1.

* * * * *